(12) United States Patent
Mrawek et al.

(10) Patent No.: US 11,163,181 B2
(45) Date of Patent: Nov. 2, 2021

(54) METHOD AND SIGNAL GENERATOR FOR CONTROLLING AN ACOUSTO-OPTICAL ELEMENT, MICROSCOPE WITH AN ARRANGEMENT COMPRISING THE SIGNAL GENERATOR AND AN ACOUSTO-OPTICAL ELEMENT

(71) Applicant: Leica Microsystems CMS GmbH, Wetzlar (DE)

(72) Inventors: Patric Mrawek, Hassloch (DE); Thorsten Koester, Edingen-Neckarhausen (DE)

(73) Assignee: LEICA MICROSYSTEMS CMS GMBH, Wetzlar (DE)

( * ) Notice: Subject to any disclaimer, the term of this patent is extended or adjusted under 35 U.S.C. 154(b) by 184 days.

(21) Appl. No.: 16/228,823

(22) Filed: Dec. 21, 2018

(65) Prior Publication Data
US 2019/0196233 A1    Jun. 27, 2019

(30) Foreign Application Priority Data
Dec. 22, 2017   (DE) .............................. 102017223759

(51) Int. Cl.
*G02F 1/11*    (2006.01)
*H03C 1/60*    (2006.01)
(Continued)

(52) U.S. Cl.
CPC ................ *G02F 1/113* (2013.01); *G02F 1/11* (2013.01); *G02F 1/23* (2013.01); *G02F 1/33* (2013.01);
(Continued)

(58) Field of Classification Search
CPC ..... G02F 1/11; G02F 1/33; G02F 2/00; G02F 1/23; G02F 1/01; G02F 1/113;
(Continued)

(56) References Cited

U.S. PATENT DOCUMENTS

2011/0194166 A1*   8/2011   Varnham ............... H01S 3/2383
359/279

FOREIGN PATENT DOCUMENTS

WO    WO 2011154501 A1    12/2011

OTHER PUBLICATIONS

Gigahertz acousto-optic modulation and frequency shifting on etchless lithium niobate integrated platform, Yu et al, 2006.*

* cited by examiner

*Primary Examiner* — Arnold M Kinkead
(74) *Attorney, Agent, or Firm* — Leydig, Voit & Mayer, Ltd.

(57) ABSTRACT

A method for generating a control signal, having at least one frequency component, for an acousto-optical element, from one frequency spectrum having the at least one frequency, or from multiple frequency spectra which together have the at least one frequency, includes the step of obtaining, from the one frequency spectrum or from the multiple frequency spectra, one transmit signal in the time domain in each case via an inverse Fourier transform. The one or the multiple transmit signals are modulated via a single-sideband modulation onto a carrier signal having a carrier frequency in order to obtain one modulated signal in each case. The control signal is obtained as a real part of the one modulated signal or as a consolidation of the real parts of the multiple modulated signals.

20 Claims, 4 Drawing Sheets

(51) Int. Cl.
*G02F 2/00* (2006.01)
*G02F 1/33* (2006.01)
*G02F 1/23* (2006.01)
*G02B 21/00* (2006.01)
*H01S 3/00* (2006.01)

(52) U.S. Cl.
CPC .................. *G02F 2/00* (2013.01); *H01S 3/00* (2013.01); *H03C 1/60* (2013.01); *G02B 21/0024* (2013.01)

(58) Field of Classification Search
CPC .. G02B 21/0024; G02B 21/0036; H03C 1/60; H01S 3/00
USPC .......... 359/279, 245; 398/185, 188; 332/170
See application file for complete search history.

METHOD AND SIGNAL GENERATOR FOR CONTROLLING AN ACOUSTO-OPTICAL ELEMENT, MICROSCOPE WITH AN ARRANGEMENT COMPRISING THE SIGNAL GENERATOR AND AN ACOUSTO-OPTICAL ELEMENT

CROSS-REFERENCE TO PRIOR APPLICATION

Priority is claimed to German Patent Application No. DE 10 2017 223 759, filed on Dec. 22, 2017, the entire disclosure of which is incorporated by reference herein.

FIELD

The present invention relates to a method and a signal generator for controlling an acousto-optical element, an arrangement comprising such a signal generator, and an acousto-optical element as well as a microscope having such an arrangement.

BACKGROUND

Regardless of the method used, a significant challenge in fields of microscopy is the provision of excitation light with one or more predefined wavelengths. Depending upon the microscopy method and/or according to the type of specimen, one or more excitation light beams, which usually must have predefined spectral properties, may be required.

For example, in the field of fluorescence microscopy, it is important to use light having the wavelength that excites fluorescence. Different wavelengths are used, in particular, if the sample contains fluorescent substances having different emission wavelengths.

In the field of confocal scanning microscopy, it is of particular interest to adapt the intensities for specific wavelengths, or to switch on or off certain wavelengths.

Wavelength-selective elements based upon the acousto-optical effect can be used for this purpose. Acousto-optical elements of this type usually have a so-called acousto-optical crystal, which is caused to vibrate by means of an acoustic transducing sensor—also called a transformer or "transducer." As a rule, such a transformer has a piezoelectric material and two or more electrodes contacting this material. By electrical connection of the electrodes with high frequencies, which are typically within the range between 10 MHz and 10 GHz, the piezoelectric material for the vibration is excited so that an acoustic wave can be produced which runs through the crystal. Acousto-optical crystals are distinguished in that the sound wave which is produced alters the optical properties of the crystal.

Examples of such acousto-optical elements include: acousto-optical tunable filters (AOTF), acousto-optical modulators (AOM), acousto-optical deflectors (AOD), acousto-optical beam splitters (AOBS), and acousto-optical beam mergers (AOBM).

A particular challenge in the use of acousto-optical elements is controlling them. The high-frequency electrical signals for the transformer are usually generated in a frequency generator (for example, a voltage-controlled oscillator (VCO), a phase-locked loop (PLL), or a synthesizer according to the DDS method (direct digital synthesis)) and amplified by means of a high-frequency amplifier in such a way that the amplitude is sufficient to cause the crystal to oscillate. In the case of multiple, simultaneously applied, different control frequencies, light beams of multiple wavelengths (for example, with an AOTF, AOBS, AOBM, or AOM) or a wavelength of one incident light beam can be simultaneously deflected into multiple light beams of various directions (for example, with an AOD).

To generate a control signal having multiple frequencies, individual frequency generators, e.g., DDS synthesizers, that generate, for example, a sinusoidal signal, can be combined by, for example, analogous mixing or addition or superposition of the output signals. Alternatively, a digital superposition, such as is shown in WO 2011/154501 A1, is also possible.

SUMMARY

In an embodiment, the present invention provides a method for generating a control signal, having at least one frequency component, for an acousto-optical element, from one frequency spectrum having the at least one frequency, or from multiple frequency spectra which together have the at least one frequency. From the one frequency spectrum or from the multiple frequency spectra, one transmit signal in the time domain is obtained in each case via an inverse Fourier transform. The one or the multiple transmit signals are modulated via a single-sideband modulation onto a carrier signal having a carrier frequency in order to obtain one modulated signal in each case. The control signal is obtained as a real part of the one modulated signal or as a consolidation of the real parts of the multiple modulated signals.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
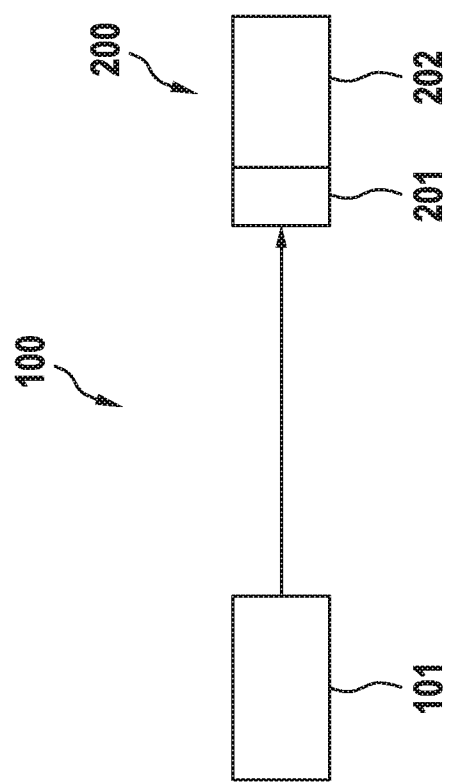
FIG. 1 shows an arrangement according to an embodiment of the invention.

It is desirable to operate acousto-optical elements with a superposition of multiple control frequencies.

According to embodiments of the present invention, a method and a signal generator for controlling an acousto-optical element, an arrangement comprising such a signal generator, and an acousto-optical element as well as a microscope having such an arrangement are provided.

An embodiment of the present invention is based upon the idea of generating the control signal for the acousto-optical element with a desired frequency spectrum having at least one frequency component by the frequency spectrum first being transformed via an inverse Fourier transform into a signal in the time domain, which is then modulated via a single-sideband modulation onto a carrier signal with a carrier frequency. The real part of this modulated signal is then the control signal having the desired frequency spectrum around the carrier frequency. Alternatively, several frequency spectra can also be transformed into multiple signals in the time domain, from which multiple modulated signals are in turn obtained whose real parts are merged for the control signal.

Embodiments of the invention provide the advantage that just one frequency spectrum made up of at least one frequency, or several frequency spectra that together have the at least one frequency, and one or more single-sideband modulators are needed to easily obtain the desired control signal for the acousto-optical element.

In particular, an embodiment of the invention provides the advantage that only one frequency spectrum having at least two frequencies, or multiple frequency spectra together having the at least two frequencies, and one or more single-sideband modulators are needed for a control signal, for an acousto-optical element, having at least two frequency components.

In an advantageous embodiment, the single-sideband modulation is implemented according to a phase method or the IQ method. Two baseband signals (I and Q) are known to be modulated onto the carrier signal by mixing. One of the two baseband signals (Q) is obtained from the transmit signal using a Hilbert transformation. For more details, refer to the relevant technical literature.

Alternatively, it is also possible that the single-sideband modulation be carried out according to the filter method or the Weaver method, both of which are known per se.

The inverse Fourier transform is preferably an inverse fast Fourier transform (iFFT) or an inverse discrete Fourier transform (iDFT). They can advantageously be implemented as a recursive algorithm, and thus be easily calculated. Non-recursive, resource-saving implementations are also possible. Thus, one or more transmit signals (time domain) can be generated in a simple manner from one or more frequency spectra (frequency range).

In another advantageous embodiment, in the case of multiple transmit signals, at least two of the multiple transmit signals are modulated via single-sideband modulation onto carrier signals having different carrier frequencies. In this way, via the carrier frequencies, frequency key points and, via each of the frequency spectra upon which the multiple transmit signals are based, the respective spectra at these frequency key points can be very easily predefined.

The one frequency spectrum or the several frequency spectra are predefined by a user, and thus are, in particular, predefinable. In particular, a control signal can thus, relatively flexibly, be generated in accordance with prevailing requirements, in order to control the acousto-optical element as desired.

For the same reason, the one or the multiple carrier frequencies are, expediently, predefined and are accordingly predefinable. These, too, usually result from the desired optical properties of the acousto-optical element.

The acousto-optical element is in turn preferably selected from among the following: an acousto-optical tunable filter, an acousto-optical modulator, an acousto-optical deflector, an acousto-optical beam splitter, and an acousto-optical beam merger.

Further advantages and embodiments of the invention are given by the description and the accompanying drawings.

It is to be understood that the features mentioned above and the features to be explained in detail below can be used not only in the respective indicated combination, but also in other combinations or alone, without departing from the scope of the present invention.

FIG. 1 schematically shows an arrangement 100 according to a preferred embodiment of the invention.

The arrangement 100 comprises a signal generator 101. The arrangement serves to control an acousto-optical element 200 which has an acousto-optical crystal 202 and a piezoelectric transducer 201 for causing the crystal 202 to vibrate mechanically. The acoustic element is used to affect light in a desired manner—for example, as a frequency selector.

Figure 2:
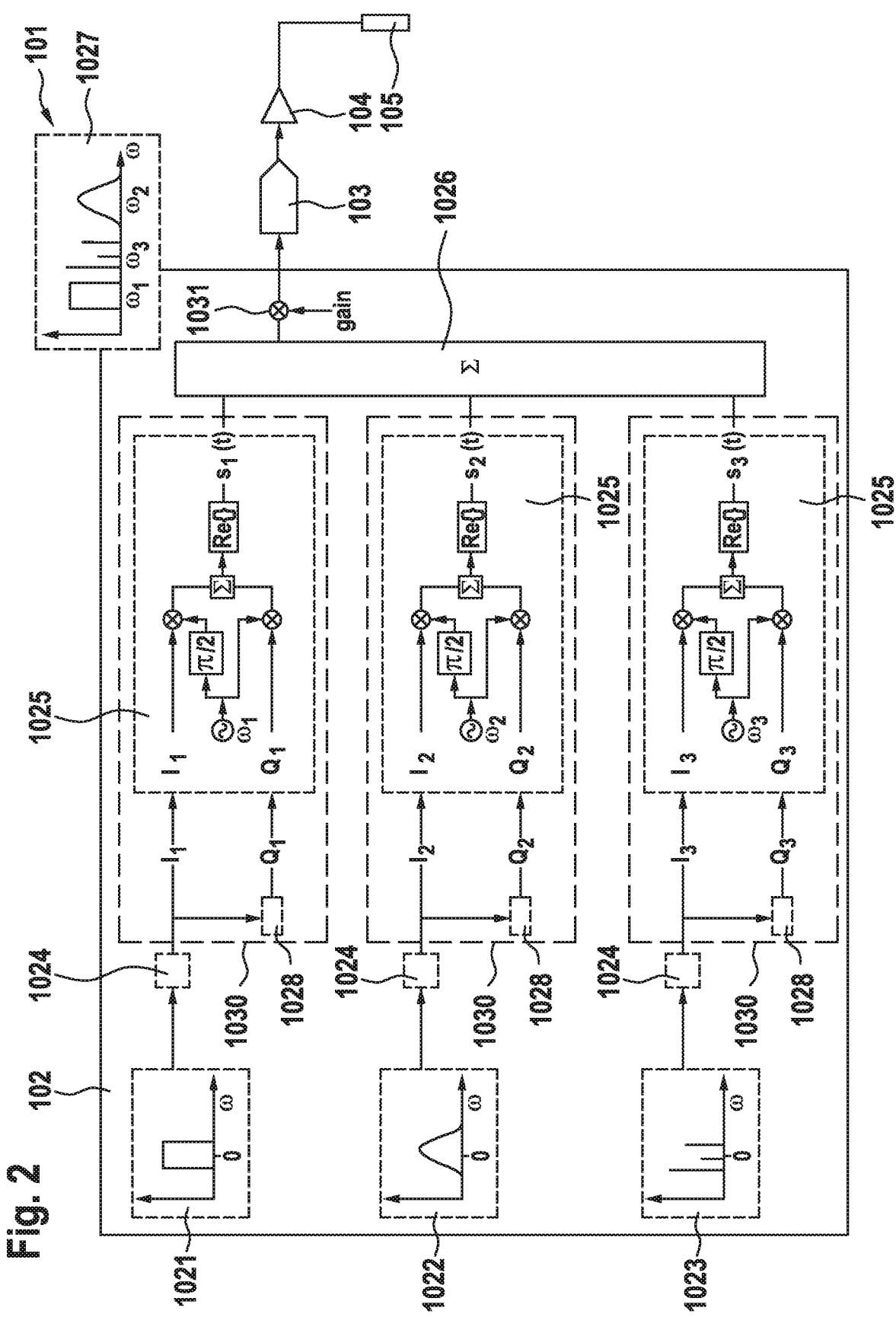
FIG. 2 shows a signal generator that is designed to implement an embodiment of a method according to the invention.

FIG. 2 shows a signal generator 101 in a function-oriented representation according to a preferred embodiment of the invention. In the example shown, the signal generator 101 has a function unit 102 for signal generation that can be designed, for example, as an FPGA. The function unit 102 is designed to implement a preferred embodiment of the invention and to generate a (digital) control signal. Furthermore, the signal generator has a digital-analog converter 103 for converting the digital control signal into an analog control signal, and an amplifier 104 for amplifying the analog control signal.

In the example shown, the control signal is based upon three frequency spectra 1021, 1022, and 1023 that are freely selectable by a user and are depicted within function unit 102. The frequency spectra can be predefined, for example, as tables with frequency and amplitude value pairs. They can be predefined, in particular, around a frequency zero.

The first exemplary frequency spectrum 1021 is a rectangular function. The second exemplary frequency spectrum 1022 is a Gaussian-type function. The third exemplary frequency spectrum 1023 is made up of three discrete frequencies having different amplitudes.

A transmit signal in the time domain is obtained, and a single-sideband modulation 1030 is supplied from three frequency spectra via an inverse fast Fourier transform 1024. The single-sideband modulation first transforms a supplied transmit signal into an I and a Q portion using a Hilbert transform 1028 ("in-phase" and "quadrature"). Both portions are mixed (i.e., frequency shifted) with a sine or cosine portion of a carrier signal having a frequency $\omega_i$, and combined to obtain a modulated signal, the real part of which is ultimately output as output signal $s_i(t)$.

For example, it is shown in FIG. 2 that, from the spectrum 1021, the output signal $s_1(t)$ is generated with frequency $\omega_1$; from the spectrum 1022, the output signal $s_2(t)$ is generated with frequency $\omega_2$; and, from the spectrum 1023, the output signal $s_3(t)$ is generated with frequency $\omega_3$.

The control signal is thus obtained as a consolidation (i.e., a sum) 1026 of the real parts of the multiple modulated signals $s_1(t)=\text{Re}[(I_1(t)+j\ Q_1(t))\ e^{i\omega_1 t}]$, $s_2(t)=\text{Re}[(I_2(t)+j\ Q_2(t))\ e^{i\omega_2 t}]$, and $s_3(t)=\text{Re}[(I_3(t)+j\ Q_3(t))\ e^{i\omega_3 t}]$. This digital signal generated in the function unit 102 can be amplified again there in a term 1031, and is then output. Then, it is converted into an analog signal in the digital-analog converter 103 and amplified in amplifier 104 before it is output to a load 105—preferably an acousto-optical element.

The spectrum 1027 of the control signal generated in this way is also shown in the figure. It is composed of the three predefined frequency spectra 1021, 1022, and 1023, wherein the frequencies are nevertheless shifted around the respective carrier frequencies.

Figure 3:
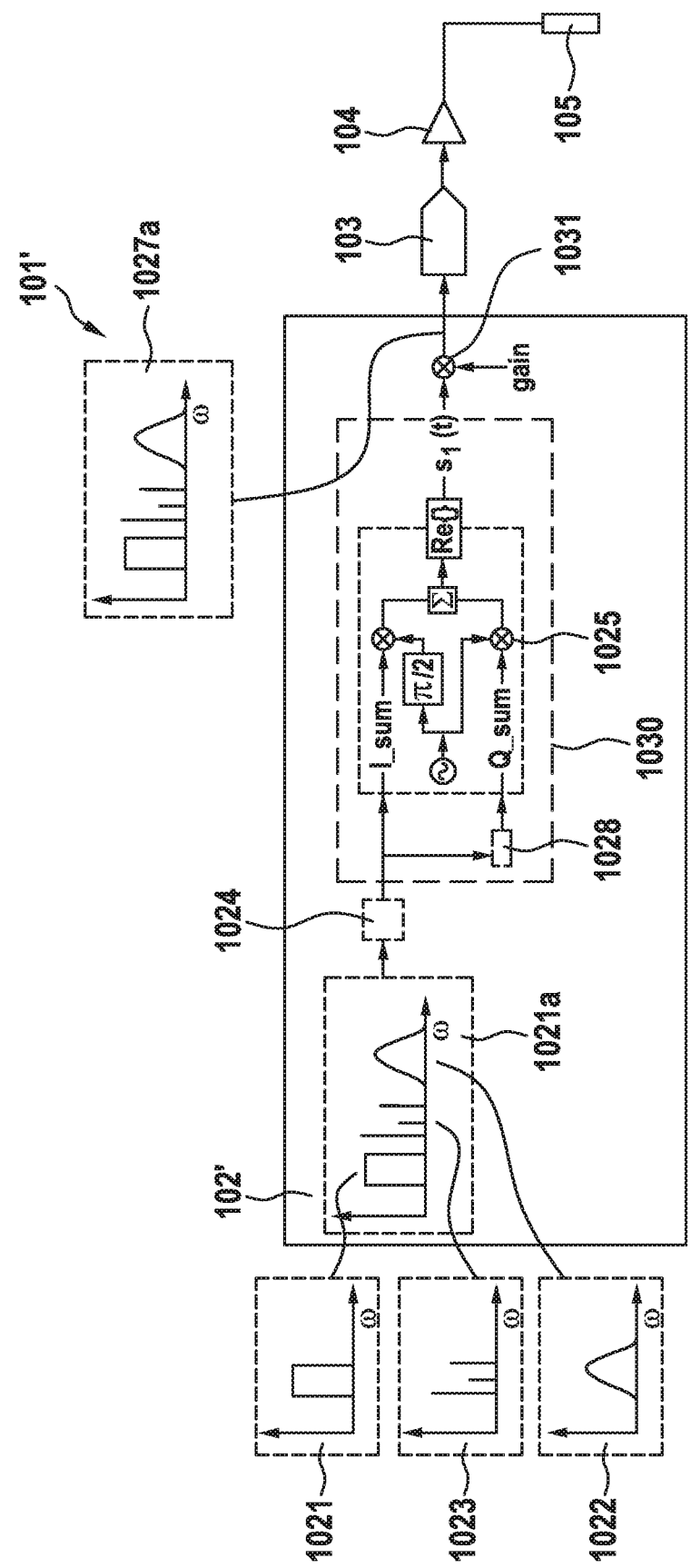
FIG. 3 shows a signal generator that is designed to implement another embodiment of a method according to the invention.

FIG. 3 also shows a signal generator 101' in a function-oriented illustration according to another preferred embodiment of the invention, which is composed of a function unit 102', the digital-analog converter 103, and the amplifier 104. The function unit 102' is designed to implement a different preferred embodiment of the invention and to generate a (digital) control signal. In this case, a control signal for an acousto-optical element is generated from a single frequency spectrum 1021*a* that already consists of three frequency spectra 1021, 1022, 1023. A transmit signal in the time domain is obtained from the frequency spectrum 1021*a* via the inverse fast Fourier transform 1024 and is supplied to the single-sideband modulation 1030 as explained above.

The control signal is obtained as a real part of the modulated signal. This digital signal $s_1(t)=Re[(I\_sum(t)+j\ Q\_sum(t))\ e^{i\omega t}]$ generated in the function unit 102' is converted into an analog signal in the digital-analog converter 103 and amplified in the amplifier 104 before it is output to the load 105—preferably an acousto-optical element.

Figure 4:
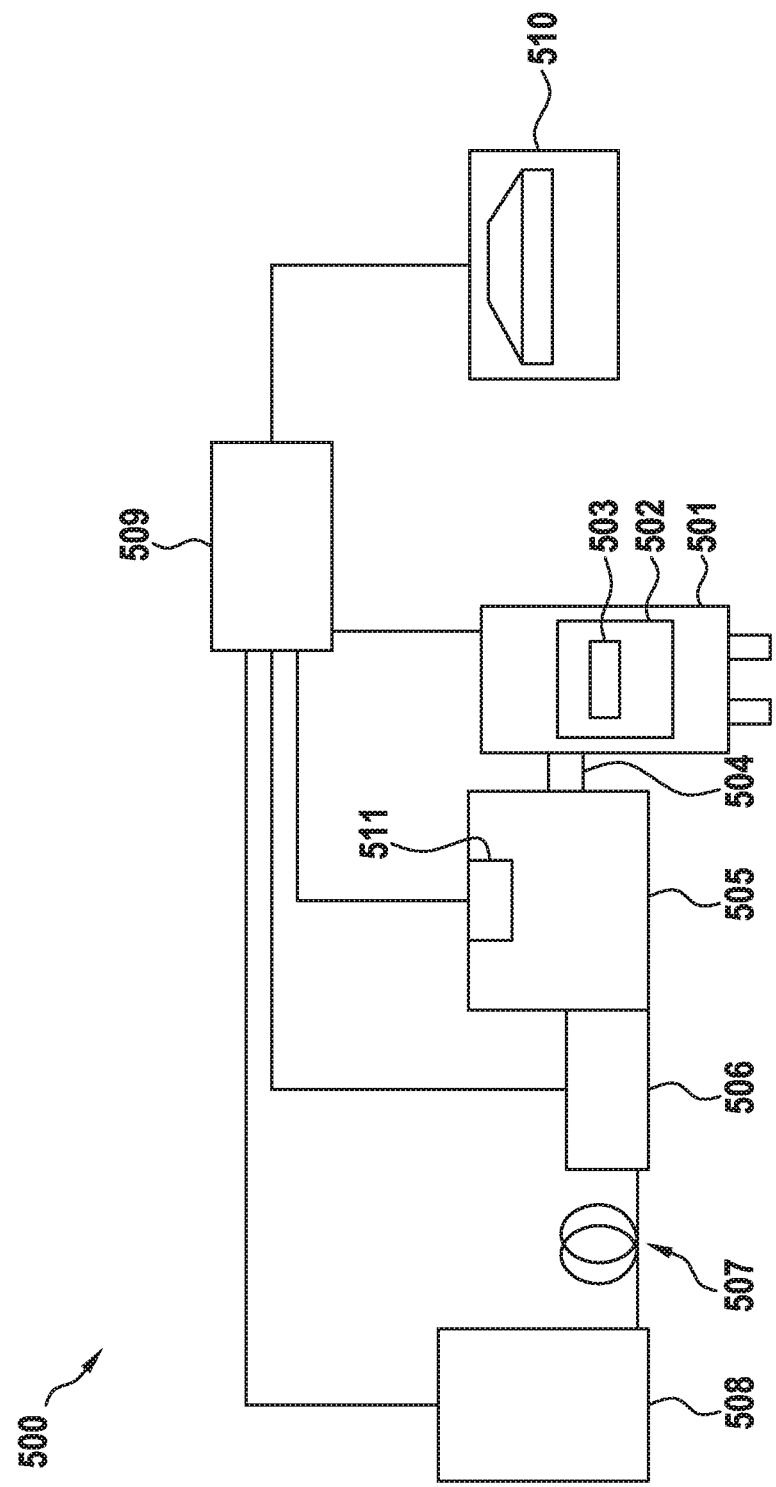
FIG. 4 shows an overview of the typical elements of a confocal microscope in a schematic view.

FIG. 4 schematically shows a confocal microscope with typical components. The overall system is designated 500 and includes a confocal scanning and detection unit 505 and an associated illumination device 506. An arrangement according to FIG. 1 is provided in the illumination device 506.

A laser light source 508 is connected to illumination device 506 via illumination fiber 507. The laser light is affected in the illumination device 506 as desired via an acousto-optical element, as described in FIGS. 1 through 3.

An optical adapter 504 for the confocal scanning and detection unit 505 on microscope stand 501 is provided. Located inside stand 501 is specimen stage 502 with a sample 503 to be examined. A control unit 509 is in communication with the individual components 508, 506, 505, and 501 via corresponding connection lines. The control unit 509 preferably contains a signal generator according to a preferred embodiment of the invention—for example, according to FIG. 2 or 3. A computer with control and display programs 510 is also connected to the control unit 509.

Arranged within the confocal scanning and detection unit 505 in a first variant is a classical confocal beam path which is constructed in a known manner with a single pinhole and a beam scanner—for example, a mirror scanner.

In a second variant, a beam path is located within the confocal scanning and detection unit 505, at which the specimen is simultaneously illuminated with one or more illumination points or ones extended in one direction. Accordingly, the photons to be detected are selected with, for example, a geometric arrangement of pinhole diaphragms (pinholes).

The specimen 503 to be examined is illuminated via microscope optics and is displayed via the same microscope optics on, in particular, a sensor arrangement 511, which, depending upon the embodiment of the scanning and detection unit 505, is made up of a photomultiplier or an array of photomultipliers. The mode of operation of a system 500 depicted in FIG. 4 is well known per se and therefore does not need to be explained in further detail here.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMBERS

100 Arrangement
101, 101' Signal generator
102, 102' Function unit
103 Digital-analog converter
104 Amplifier
105 Load
200 Acousto-optical element
201 Piezoelectric transducer
202 Acousto-optical crystal
500 Microscope system
501 Microscope stand with microscope optics
502 Specimen stage
503 Specimen
504 Optical adapter
505 Confocal scanning and detection unit
506 Illumination device
507 Illumination fiber
508 Laser light source
509 Control unit with signal generator
510 Computer with control and display programs
511 Sensor arrangement

The invention claimed is:

1. A method for generating a control signal, having at least one frequency component, for an acousto-optical element, from one frequency spectrum having the at least one frequency, or from multiple frequency spectra which together have the at least one frequency, the method comprising:
    obtaining, from the one frequency spectrum or from the multiple frequency spectra, one transmit signal in the time domain in each case via an inverse Fourier transform;
    modulating the one or the multiple transmit signals via a single-sideband modulation onto a carrier signal having a carrier frequency in order to obtain one modulated signal in each case; and
    obtaining the control signal as a real part of the one modulated signal or as a consolidation of the real parts of the multiple modulated signals,
    wherein the method is implemented by a microscope.

2. The method according to claim 1, wherein a control signal, having at least two frequency components, for an acousto-optical element is generated from one frequency spectrum having the at least two frequencies, or from multiple frequency spectra, which together have the at least two frequencies.

3. The method according to claim 1, wherein the single-sideband modulation is carried out according to the IQ method.

4. The method according to claim 1, wherein the inverse Fourier transform is an inverse fast Fourier transform or an inverse discrete Fourier transform.

5. The method according to claim 1, wherein the multiple transmit signals are obtained from the multiple frequency spectra, and wherein at least two of the multiple transmit signals are modulated via the single-sideband modulation onto different carrier frequencies.

6. The method according to claim 1, wherein the one frequency spectrum or the multiple frequency spectra are predefined.

7. The method according to claim 1, wherein the one or the multiple carrier frequencies are predefined.

8. A signal generator for controlling an acousto-optical element, the signal generator being configured to carry out the method according to claim 1.

9. An arrangement comprising the signal generator according to claim 8 and an acousto-optical element.

10. The arrangement according to claim 9, wherein the acousto-optical element is selected from the group consisting of: an acousto-optical tunable filter, an acousto-optical modulator, an acousto-optical deflector, an acousto-optical beam splitter, and an acousto-optical beam merger.

11. A microscope having the arrangement according to claim 9.

12. A method for generating a control signal, having at least one frequency component, for an acousto-optical element, from one frequency spectrum having the at least one frequency, or from multiple frequency spectra which together have the at least one frequency, the method comprising:
obtaining, from the one frequency spectrum or from the multiple frequency spectra, one transmit signal in the time domain in each case via an inverse Fourier transform;
modulating the one or the multiple transmit signals via a single-sideband modulation onto a carrier signal having a carrier frequency in order to obtain one modulated signal in each case; and
obtaining the control signal as a real part of the one modulated signal or as a consolidation of the real parts of the multiple modulated signals,
wherein the single-sideband modulation is carried out according to the IQ method.

13. A signal generator for controlling an acousto-optical element, the signal generator being configured to carry out the method according to claim 12.

14. An arrangement comprising the signal generator according to claim 13 and the acousto-optical element.

15. A method for generating a control signal, having at least one frequency component, for an acousto-optical element, from one frequency spectrum having the at least one frequency, or from multiple frequency spectra which together have the at least one frequency, the method comprising:
obtaining, from the one frequency spectrum or from the multiple frequency spectra, one transmit signal in the time domain in each case via an inverse Fourier transform;
modulating the one or the multiple transmit signals via a single-sideband modulation onto a carrier signal having a carrier frequency in order to obtain one modulated signal in each case; and
obtaining the control signal as a real part of the one modulated signal or as a consolidation of the real parts of the multiple modulated signals,
wherein the inverse Fourier transform is an inverse fast Fourier transform or an inverse discrete Fourier transform.

16. A signal generator for controlling an acousto-optical element, the signal generator being configured to carry out the method according to claim 15.

17. An arrangement comprising the signal generator according to claim 16 and the acousto-optical element.

18. A method for generating a control signal, having at least one frequency component, for an acousto-optical element, from one frequency spectrum having the at least one frequency, or from multiple frequency spectra which together have the at least one frequency, the method comprising:
obtaining, from the one frequency spectrum or from the multiple frequency spectra, one transmit signal in the time domain in each case via an inverse Fourier transform;
modulating the one or the multiple transmit signals via a single-sideband modulation onto a carrier signal having a carrier frequency in order to obtain one modulated signal in each case; and
obtaining the control signal as a real part of the one modulated signal or as a consolidation of the real parts of the multiple modulated signals,
wherein the multiple transmit signals are obtained from the multiple frequency spectra, and wherein at least two of the multiple transmit signals are modulated via the single-sideband modulation onto different carrier frequencies.

19. A signal generator for controlling an acousto-optical element, the signal generator being configured to carry out the method according to claim 18.

20. An arrangement comprising the signal generator according to claim 19 and the acousto-optical element.

* * * * *